United States Patent [19]

Matsuo et al.

[11] 4,401,054
[45] Aug. 30, 1983

[54] PLASMA DEPOSITION APPARATUS

[75] Inventors: Seitaro Matsuo, Hachioji; Hideo Yoshihara, Sekimachi; Shinichi Yamazaki, Chofu, all of Japan

[73] Assignee: Nippon Telegraph & Telephone Public Corporation, Tokyo, Japan

[21] Appl. No.: 257,616

[22] Filed: Apr. 27, 1981

[30] Foreign Application Priority Data

May 2, 1980 [JP] Japan ............................. 55/57877
Feb. 13, 1981 [JP] Japan ............................. 56/18986

[51] Int. Cl.³ ........................................... C23C 13/08
[52] U.S. Cl. .................................. 118/723; 118/50.1; 118/724; 427/45.1; 427/47; 204/164; 422/186.01; 422/186.29
[58] Field of Search ..................... 118/50.1, 715, 724, 118/722, 723; 427/45.1, 41, 39, 47; 250/527, 531, 528, 529; 219/10.55 R; 204/177, 193, 164

[56] References Cited

U.S. PATENT DOCUMENTS

| 3,330,752 | 7/1967 | Hallen et al. | 118/723 X |
| 3,916,034 | 10/1975 | Tsuchimoto | 427/93 X |
| 3,937,917 | 2/1976 | Consoli | 219/10.55 R X |
| 4,065,369 | 12/1977 | Ogawa et al. | 250/531 X |
| 4,123,316 | 10/1978 | Tsuchimoto | 250/531 X |
| 4,274,426 | 6/1981 | Garrett | 165/80 E |

OTHER PUBLICATIONS

Cohen, "Thin Si Films Can Form at Room Temperature", Electronics, Nov. 3, 1981, pp. 82 and 84.

Rosler et al. "A Production (etc) "Solid State Technology Jun. 1976 pp. 45-50.
Sinha et al. "Reactive Plasma (etc)" J. Electrochem. Soc. Solid-State Science and Technology Apr. 1978 pp. 601-608.
Tsuchimoto "Plasma Stream Transport Method (1) etc." J. Vac. Sci. Techol. 15(1), Jan./Feb. 1978 pp. 70-73.
Tsuchimoto "Plasma (etc) (2) (etc)" J. Vac. Sci. Technol. 15(5) Sep./Oct. 1978 pp. 1730-1733.
Tsuchimoto "Operation Modes (etc)" J. Vac. Sci. Technol. 17(6) Nov./Dec. 1980 pp. 1336-1340.

Primary Examiner—John D. Smith
Assistant Examiner—Bernard F. Plantz
Attorney, Agent, or Firm—Cushman, Darby & Cushman

[57] ABSTRACT

A plasma deposition apparatus having a plasma formation chamber and a specimen chamber which are arranged separately. Gaseous material and microwave power are introduced to the plasma formation chamber to generate plasma by a microwave discharge through electron cyclotron resonance. The plasma is extracted to the specimen chamber from the plasma extracting orifice. In the specimen chamber, the plasma is accelerated by the effect of divergent magnetic field to irradiate the surface of the specimen so as to deposit a thin film on the specimen substrate. A high-quality thin film is formed with a high efficiency at a low temperature. Accordingly, a thin film can be deposited on a specimen substrate having a low heat resistivity. The plasma deposition apparatus is useful for manufacturing various kinds of electronic devices.

12 Claims, 14 Drawing Figures

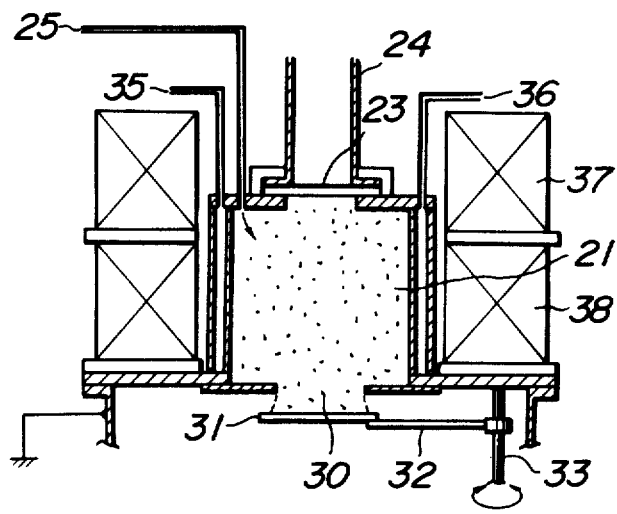
FIG_4
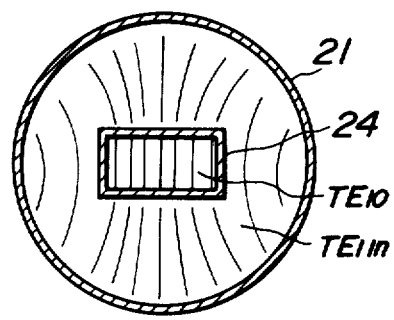
FIG_5

FIG_9

FIG_11
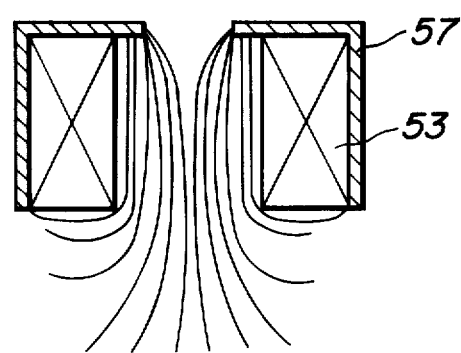
FIG_12
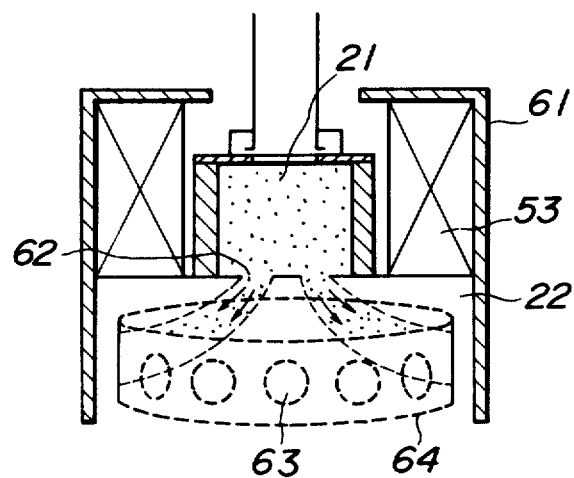

4,401,054

PLASMA DEPOSITION APPARATUS

BACKGROUND OF THE INVENTION

The present invention relates to a plasma deposition apparatus into which raw material gases are introduced to deposit various kinds of material on a specimen substrate by using plasma reaction so as to form a thin film of Si, $Si_3N_4$, $SiO_2$, $MoSi_2$, $WSi_2$ or the like and which is utilized to manufacture various electronic devices such as semiconductor integrated circuits.

As an apparatus for forming a thin film, CVD (Chemical Vapor Deposition) apparatus is known and is of particular used frequently as means for forming various thin films in a semiconductor integrated circuit, the CVD apparatus can form thin films such as $Si_3N_4$, $SiO_2$, Si or the like with a high purity and a high quality. In the reaction process of forming a thin film, a reaction vessel in which specimen substrates are arranged is heated at a high temperature condition of 500°–1,000° C. Raw material to be deposited is supplied to the vessel in the form of gaseous composition, so that gaseous molecules are thermally dissociated and combined in the gas and on the surface of the specimen so as to form a thin film.

This method, however, utilizes the thermal reaction in the high temperature condition, and accordingly the kinds of specimen substrates on which a thin film is to be deposited are limited to substrates which have a heat resistance against the high temperature and characteristics which are not deteriorated by the high temperature. Therefore, there is a disadvantage in that an area to which the CVD apparatus is applied is extremely restricted. In addition, there is also another disadvantage in that it is difficult to control characteristics of the formed film such as internal stress.

Recently, in order to solve these disadvantages, a plasma-enhanced CVD apparatus has been developed in which the plasma reaction is utilized to perform a reaction similar to that of CVD apparatus at a relatively low temperature to form a thin film. The plasma-enhanced CVD apparatus was explained, for instance, by Richard S. Rosler et al. in "A Production Reactor for Low Temperature Plasma-Enhanced Silicon Nitride Deposition", SOLID STATE TECHNOLOGY/-June 1976, pp. 45–50. A. K. Sinha et al. also disclosed the plasma-enhanced CVD in "Reactive Plasma Deposited Si—N Films for MOS-LSI Passivation", J. Electrochem. Soc.: SOLID-STATE SCIENCE AND TECHNOLOGY, April 1978, pp. 601–608. This plasma CVD apparatus is comprised of a specimen chamber, a gas introducing system and an exhausting system. There are arranged inside of the specimen chamber a radio frequency electrode and a specimen table which are opposite to each other. This specimen table has a heating mechanism. Explanation will be made with respect to one example of forming a silicon nitride film. Silane gas ($SiH_4$) and ammonia gas ($NH_3$) are introduced as raw material into the specimen chamber from the gas introducing system. While these raw material gases are exhausted from the exhausting system, the gaseous pressure in the specimen chamber is kept constant within a range from 0.1 to 10 Torr. Radio frequency power is supplied to the specimen chamber to produce plasma. The gaseous molecules of $SiH_4$ and $NH_3$ are dissociated in the plasma. Subjected to the incidence of ions and electrons besides the dissociation in the plasma, silicon nitride is deposited on a surface of a specimen substrate on the specimen table. In this case, however, the specimen table is heated at 300°–500° C. and also it is necessary to additionally use a thermal reaction in a high temperature condition. Accordingly, the plasma-enhanced CVD apparatus is still insufficient for the purpose of the formation of thin film while the specimen substrate is kept at a low temperature. In addition, the dissociation of $SiH_4$ and $NH_3$ are not sufficient, so that H is incorporated in a formed film or the Si—N bond is not sufficient. As a result, a thin film is not obtained with a high quality. It follows that there is a disadvantage in that the plasma-enhanced CVD apparatus is not applicable to the fabrication of such semiconductor integrated circuits that require a specimen substrate with a low heat resistance and a film with a high quality.

On the other hand, as another method for utilizing the plasma, a method called the plasma stream transport method is known. This method was, for instance explained by Takashi Tsuchimoto in "Plasma stream transport method (1) Fundamental concept and experiment", J. Vac. Sci. Technol. 15(1), January/February 1978, pp. 70–73, and "Plasma stream transport method (2) Use of charge exchange plasma source", J. Vac. Sci. Technol. 15(5), September/October 1978, pp. 1730–1733. These papers describe the studies on the formation and control of the plasma stream for transporting material. This method is applied to both formation of a thin film and etching. The device for this method is composed of a plasma source, which utilizes the microwave discharge, and a specimen chamber provided with the parallel magnetic field. By using the magnetic pipe effect of the parallel magnetic field, the plasma stream is transported to a surface of a specimen from the plasma source through thermal diffusion, thereby depositing a film on the specimen. However, when applying this method to film formation, the plasma stream is merely transported through thermal diffusion, while the effects of incidence and impingement of ions, electrons, etc. on the film-forming reaction on the specimen surface are scarcely used. Accordingly, also in the plasma stream transport method, it was necessary to heat the specimen at a temperature of 300°–500° C. so as to use a thermal reaction through the heat energy at the same time. In addition, the plasma source used in the plasma stream transport method utilizes the microwave discharge with a discharge chamber of coaxial construction or the microwave discharge in a wave guide cylinder. Accordingly, the diameter of the plasma stream is as small as about 2 cm and, thus, the area where a film can be formed is small. This results in the disadvantage in that the productivity is considerably low. Moreover, with this method, it is necessary to lower the gas pressure in the specimen chamber so as not to attenuate the density of the plasma which reaches the specimen surface. It is further necessary to set the inside of the plasma source to a gas pressure which is suitable for discharge. For this reason, the diameter of the orifice to introduce the plasma cannot be increased and, consequently, it is difficult to increase the diameter of the plasma stream.

On the other hand, it was attempted to scan the plasma stream by using a magnetic coil for scanning in order to increase the area where a film can be formed. With this method, however, the film forming speed reduces accordingly and productivity is not improved. This method also requires a complicated composition. Moreover, when it is for example intended to introduce N₂ gas to the plasma source and to introduce SiH₄ gas into the specimen chamber to form a silicon nitride film for the purpose of avoiding dissipation of raw material gases or formation of detrimental deposits inside the plasma source, there is a disadvantage in that the interaction between the N₂ plasma stream and SiH₄ gas is insufficient so that a film of a high quality cannot be formed with a high efficiency. This is because the diameter of the plasma stream is small and, in addition, the gas pressure of SiH₄ in the specimen chamber cannot be increased.

SUMMARY OF THE INVENTION

The present invention has been made under the circumstances described above. An object of the present invention is to provide a plasma deposition apparatus which can form a thin film of a high quality over a large area with a good productivity, while keeping the specimen substrate at a low temperature, by utilizing the respective features of the conventional plasma deposition apparatuses as mentioned above, generating highly active plasma and enhancing the reaction of the plasma of, ions and electrons, at a surface of the specimen.

Another object of the present invention is to provide a plasma deposition apparatus which can efficiently form a high-quality thin film at a low temperature by extracting the plasma, which is generated by a microwave discharge through the electron cyclotron resonance, with the aid of the action of a divergent magnetic field, and by irradiating the plasma on a surface of a specimen.

According to one aspect of the present invention, in a plasma deposition apparatus in which gases are introduced into a vacuum vessel, plasma is generated, molecules in the plasma are activated and reacted on a specimen substrate, on which a film is to be formed, so as to deposit a thin film on the specimen substrate, the plasma deposition apparatus comprises a specimen chamber where a specimen table for placing the specimen substrate thereon is arranged, and a plasma formation chamber arranged separately from the specimen chamber in order to make the gases, which are to be activated, into the plasma condition, the plasma formation chamber being provided with a microwave introducing window, a microwave introducing means and a plasma extracting orifice which is formed in the wall opposite to the microwave introducing window in order to extract the plasma stream into the specimen chamber, a magnetic circuit being installed at the periphery of the plasma formation chamber so as to form a magnetic flux density necessary to bring about electron cyclotron resonance in the plasma formation chamber and to form, in the specimen chamber, a divergent magnetic field wherein the intensity of the magnetic flux density reduces at an appropriate gradient from the plasma formation chamber toward the specimen table in the specimen chamber.

In this plasma deposition apparatus, it is preferable that the plasma formation chamber is set to a shape and dimensions satisfying the conditions of a microwave cavity resonator.

The plasma deposition apparatus may provide with a gas introducing system for the plasma formation chamber and a gas introducing system for the specimen chamber.

It is also preferable that the plasma deposition apparatus has a shutter which is opened and closed so as to interrupt the plasma stream is arranged between the plasma extracting orifice and the specimen table. Preferably, the plasma extracting orifice may have a metal grid plate.

It is also preferable that a radio frequency power is applied to the specimen table so as to generate a negative self-bias voltage at the surface of the specimen.

Furthermore, the specimen table may be in the electrically floating condition.

According to another aspect of the present invention, in a plasma deposition apparatus having a plasma formation chamber and a specimen chamber where a specimen table for placing a specimen thereon is arranged, plasma raw materials and a microwave power being introduced into the plasma formation chamber so as to generate plasma, the plasma formation chamber being provided with an end face plate which has a plasma extracting orifice for extracting the plasma as a plasma stream into the specimen chamber, a magnetic circuit being installed at the periphery of the plasma formation chamber, the magnetic circuit serving to form a magnetic flux density with an intensity necessary to increase the efficiency of plasma formation in the plasma formation chamber and to form, in the specimen chamber, a divergent magnetic field in which the intensity of the magnetic flux density reduces at an appropriate gradient from the plasma formation chamber toward the specimen table in the specimen chamber, wherein the plasma formation chamber has a structure of a cavity resonator with reference to the microwave power introduced for forming the plasma, and the end face plate has a movable structure so as to adjust the cavity resonance condition of the microwave.

In a preferred embodiment of a plasma deposition apparatus according to the present invention, the specimen table may have a cooling mechanism. The magnetic circuit may have a magnetic coil to form the divergent magnetic field for forming the plasma and extracting the plasma, and high permeability material is arranged at the periphery of the magnetic coil, so that the distribution of the magnetic field in the plasma formation chamber and the specimen chamber can be adjusted by means of the arrangement and the shape of the high permeability material. Here, it is preferable that the plasma extracting orifice has a concentric circular opening, the specimen table is formed by a cylinder which is coaxial with the center axis of the magnetic coil, so that at least one specimen can be arranged at the inner surface of the cylinder, and an outer case made of the high permeability material is extended from the periphery of the magnetic coil up to the periphery of the specimen chamber.

BRIEF DESCRIPTION OF THE DRAWINGS

FIG. 4 is a sectional view showing a modification of a plasma deposition apparatus according to the present invention;

FIG. 5 is a diagram showing the electric field distribution of microwave in the plasma formation chamber of a plasma deposition apparatus according to the present invention;

FIG. 11 is a diagram for explaining the embodiment shown in FIG. 10;

FIG. 12 is a sectional view showing a modification of the embodiment of FIG. 10 according to the present invention.

DESCRIPTION OF PREFERRED EMBODIMENTS

Figure 1:
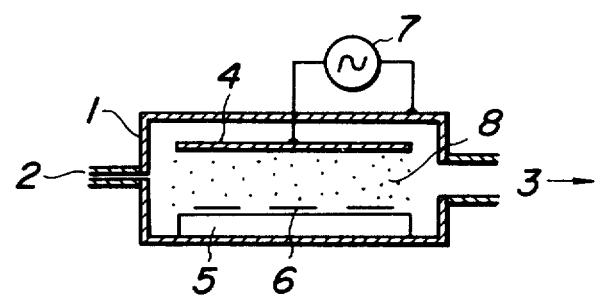
FIG. 1 is a sectional view showing the configuration of a conventional plasma-enhanced CVD apparatus which utilizes a radio frequency discharge.

First, the principle structure of a plasma-enhanced CVD apparatus as a conventional plasma deposition apparatus is shown in FIG. 1. In FIG. 1, the plasma deposition apparatus is composed of a specimen chamber 1, a gas introducing system 2 and an exhausting system 3. A radio frequency electrode 4 for generating plasma and a specimen table 5 are arranged in the specimen chamber 1. The specimen table 5 is opposite to the radio frequency electrode 4 and is provided with a heating mechanism. A radio frequency power is applied from a radio frequency power supply 7 to the electrode 4, plasma 8 is generated generally in the condition of a gas pressure of 0.1–10 Torr, and a thin film is formed on the specimen substrate 6 which is arranged on the specimen table 5. For instance, a silicon nitride film is formed as explained below. As in the case of a conventional CVD apparatus, silane gas ($SiH_4$) and ammonia gas ($NH_3$) are introduced from the gas introducing system 2. The gas pressure is kept constant while exhausting the gases from the exhausting system 3. A radio frequency power is fed from the radio frequency power source 7 to the radio frequency electrode 4, thereby generating plasma 8 to dissociate $SiH_4$ and $NH_3$. Also under the action of the incidence of ions and electrons in addition to the dissociation in the plasma, a reaction and a combination occur on the surface of the specimen 6, and silicon nitride is deposited on the surface. In this case, the specimen table 5 is heated at 300°–500° C. Such a plasma deposition apparatus makes it possible to form a film at a considerably low temperature, compared with a conventional CVD apparatus which requires a high temperature of 800°–900° C. With this apparatus, however, the dissociation of $SiH_4$ and $NH_3$ is not sufficient, so that H is incorporated in a deposited film or the Si—N bond is not sufficient. Thus, this apparatus has a disadvantage in that a film of high quality cannot be obtained.

Figure 2:
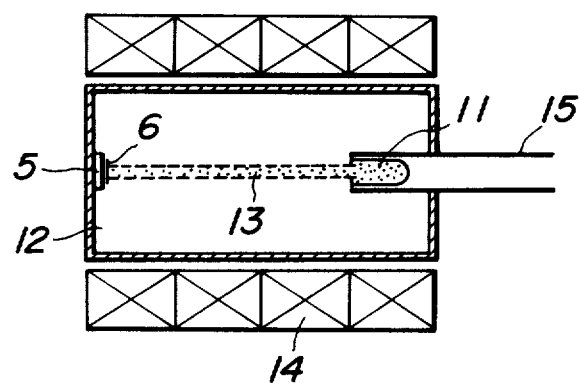
FIG. 2 is a sectional view showing the configuration of a conventional plasma stream transport apparatus which utilizes a microwave discharge.

On the other hand, Takashi Tsuchimoto proposed an apparatus for forming a thin film by utilizing the plasma generated through a microwave discharge, as shown in FIG. 2. This plasma stream transport apparatus is composed of a plasma source 11 and a specimen chamber 12 which is provided with parallel magnetic field. A film is deposited on a specimen 6 by transporting a plasma stream 13 from a plasma source 11 to the surface of the specimen 6 through thermal diffusion. Reference numeral 14 is the magnetic coil for generating the parallel magnetic field, and 15 is the microwave guide cylinder. With this method, the gas pressure is low and a plasma with a high activity can be formed. Therefore, this method has an advantage in that nitrogen gas ($N_2$) can be used instead of $NH_3$ so as to form a silicon nitride film in combination with $SiH_4$. This method, however, uses the parallel magnetic field to introduce the plasma stream 13 from the plasma source 11 by means of thermal diffusion. Therefore, the action of electrons and ions of the plasma on the surface of the specimen is not sufficient. As a result, this method is disadvantageous in that it is necessary to heat the specimen at a temperature of 300°–500° C., like the conventional plasma deposition apparatus. In addition, the plasma source 11 used is generated by utilizing a discharge inside the microwave guide cylinder 15 and, accordingly, the diameter of the plasma stream 13 is as small as about 2 cm. Therefore, there is a disadvantage in that the area where a film can be formed is extremely small compared with the conventional plasma deposition apparatus, and the productivity is low.

Figure 3:
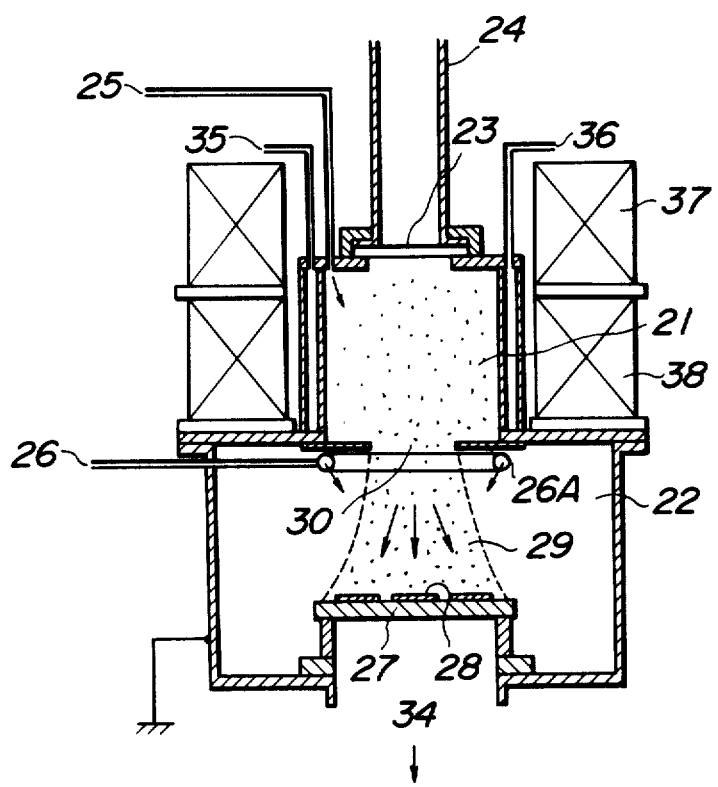
FIG. 3 is a sectional view showing one embodiment of a plasma deposition apparatus according to the present invention.

The basic configuration of a plasma deposition apparatus according to the present invention is illustrated in FIG. 3. In FIG. 3, reference numeral 21 is a plasma formation chamber, and 22 is a specimen chamber. Reference numeral 23 indicates a microwave introducing window. Window 23 may be made of a silica glass plate. As the microwave source (not shown), for instance, a magnetron with a frequency of 2.45 GHz may be used. The microwave source will be connected with rectangular waveguide 24, which is extending outward from the microwave introducing window 23, via a matching device, a microwave power meter and an isolator, which are not shown in the figure. The plasma formation chamber 21 is made of a stainless steel and is cooled with water through a water supply port 35 and a water drain port 36 so as to prevent a temperature rise due to the plasma formation. The gas introducing system comprises two systems. The first gas introducing system 25 is used to introduce the gas into the plasma formation chamber 21. The second gas introducing system 26 has a circular stainless steel pipe 26A, which is provided with small through holes at several positions, so as to introduce the gas into the specimen chamber 22 and to directly guide the gas toward the surface of the specimen 28 on the specimen table 27, which is arranged in the specimen chamber 22. In the plasma formation chamber 21, a plasma extracting orifice 30 for taking off a plasma stream 29 is arranged at the end opposite to the microwave introducing window 23.

Below the plasma extracting orifice 30, a shutter 31 as shown in FIG. 4 may be arranged so that the plasma stream can be interrupted. The shutter 31 is fixed to a rotary shaft 33 through a lever 32, so that the rotary shaft 33 can be operated from the outside of the specimen chamber 22 so as to control the opening-closing of the shutter 31 with reference to the orifice 30. It is sufficient that the shutter 31 is arranged so as to interrupt the plasma stream 29 between the orifice 30 of the plasma formation chamber 21 and the specimen table 27. Thus, the shutter 31 can be arranged either upstream or downstream from the circular stainless steel pipe 26A according to the design conditions. It is preferable that the opening-closing of the shutter 31 is controlled as follows: First, when using the apparatus at the beginning, the shutter 31 is kept closed until the setting of various conditions is completed. The shutter 31 is opened after the setting of conditions is over and the plasma stream 29 reaches the steady state. After forming a thin film on the specimen, the shutter 31 is closed and then the conditions are released. Furthermore, when performing mass-production of thin films, it is preferable that the shutter 31 is opened and closed to match the sequential feeding of wafers onto the specimen table 27.

Moreover, in FIG. 3, it is preferable that the specimen table 27 is installed in an electrically floating condition with reference to the plasma formation chamber 21 and that a heater (not shown) is incorporated as an auxiliary means to heat the specimen substrate 28. The specimen chamber 22 is connected with an exhausting system 34. The exhausting system 34 may be constituted, for instance, by an oil diffusion pump with an exhausting capacity of 2,400 l/sec and an oil rotary pump with an exhausting capacity of 500 l/min.

As the conditions of a microwave cavity resonance, the plasma formation chamber 21 should satisfy the following conditions concerning the length of cavity (l):

$$l = (\lambda g/2) \times n$$

where $\lambda g$ is the wavelength in the waveguide when the chamber 21 is assumed to be a cylindrical waveguide, and n is a positive integer. Value $\lambda g$ can be represented by:

$$\lambda g = \lambda / \sqrt{1 - (\lambda/\lambda c)^2}$$

where $\lambda$ is the wavelength in a free space and $\lambda c$ is the cutoff wavelength. For instance, $\lambda = 12.24$ cm when the microwave frequency is 2.45 GHz, and $\lambda c = 34.1$ cm when the wave in $TE_{11}$ mode is introduced into a circular waveguide (with an inner diameter of 20 cm). In such a case, $\lambda g = 13.1$ cm and the length (l) of the cavity resonator is 19.7 cm, if n=3, from the equation set forth above. Accordingly, for the $TE_{10}$ mode in the rectangular waveguide 24, the plasma formation chamber 21 employs the circular cavity resonance mode $TE_{113}$ (n=3), which has an electric field distribution as shown in FIG. 5, and a cylinderical form with a diameter of 20 cm and a height of 20 cm in terms of the inner dimensions, as an example of satisfying the conditions of the microwave cavity resonator. In this way, the electric field strength of the microwave is increased and the efficiency of the microwave discharge is improved. For the plasma formation chamber 21 with an inner diameter of 20 cm, the plasma extracting orifice 30 is formed as a circular orifice with a diameter of 10 cm, so that it plays a role of an iris in the configuration of the microwave circuit, thereby constituting a reflection surface for the microwave and allowing the plasma formation chamber 21 to function as a microwave cavity resonator.

Figure 6:
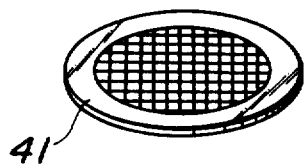
FIGS. 6 and 7 are an oblique view and a circuit diagram, respectively, which show modifications according to the present invention.
Figure 7:
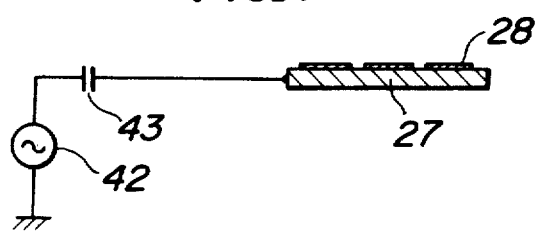

Alternatively, the metal grid plate 41 as shown in FIG. 6 may be arranged instead of the plasma extracting orifice 30. In this case, the grid space in the grid plate 41 is decided so that it reflects the microwave to the inside of the plasma formation chamber 21, but transmits the plasma stream 29. Therefore, the grid should preferably be coarse, provided that the grid space is sufficiently small compared with the wavelength of the microwave. The grid space is 1-3 cm for a microwave frequency of 2.45 GHz. When such a grid plate 41 is used, uniform deposition can be achieved by rotating the specimen table 27, thereby improving the productivity.

Around the periphery of the plasma formation chamber 21, two-split magnetic coils 37 and 38 are installed to decide the strength of the magnetic field, which are generated by them, so that the conditions of the electron cyclotron resonance by the microwave are established inside the plasma formation chamber 21. That is, the cyclotron resonance is established when the cyclotron angular frequency $\omega_c$ of the electron in the magnetic field ($\omega_c = eB/m$, where e is the charge, B is the magnetic flux density, and m is the mass) is equal to the value $\omega$ of the microwave where the electric field is perpendicular to the magnetic field. The value $\omega$ is expressed as follows: $\omega = 2\pi f$. For instance, for the microwave with a frequency f of 2.45 GHz, the magnetic coils 37 and 38 are set so that the maximum magnetic flux density of about 1,000 G can be obtained, because a magnetic flux density of 875 G is required for the electron cyclotron resonance. Explaining in more detail, magnetic coils 37 and 38 are arranged so that the top of the plasma formation chamber 21 is positioned in the region where the magnetic field strength is the maximum and approximately uniform, that is, in the region of the central one-third section in the vertical direction (in the figure) of magnetic coils 37 and 38 in FIG. 3. In this condition, the magnetic field strength in this region is set to 875 G or more when f=2.45 GHz.

The appropriate diameter of the plasma formation chamber 21 is 10–30 cm. The dimension should be decided within this range, and the cavity resonance conditions $\lambda gn/2$ described above should be decided. From the standpoint of uniform plasma generation, it is preferable that $n = 1 \sim 5$. If the diameter of the plasma formation chamber 21 is above 30 cm, extremely large magnetic coils 37 and 38 are required, making it difficult to realize the system. The shape of plasma formation chamber 21 is not limited to a cylindrical shape. Thus, the plasma formation chamber 21 may be rectangular.

Use of the magnetic field as mentioned above not only has the effect to effectively impart energy to the electrons through the electron cyclotron resonance but also has the effect to prevent the formed electrons and ions from dissipating perpendicularly to the magnetic field. In the magnetic field direction, the divergent magnetic field of which strength decreases in the direction of the plasma orifice 30 is employed, so that the plasma can be efficiently taken off from the plasma extracting orifice 30. As the basic structure concerning the plasma formation mentioned above, approximately the same concept as that for the plasma formation in the "Ion Shower Apparatus", which is the subject of the previous patent application of this Applicant (Japanese Patent Application No. 48,535/1979), may be employed.

The system is constituted so that the magnetic field generated by magnetic coils 37 and 38 can be utilized for the electron cyclotron resonance in the plasma formation chamber 21 and, in addition, can reach the specimen chamber 22. That is, the bottom of the plasma formation chamber 21 is approximately aligned with the bottom of the magnetic coil 38 so that the distribution of the magnetic field in the plasma extracting orifice 30 and the specimen chamber 22 resembles that of an air-core coil, thereby forming a divergent magnetic field with such an appropriate gradient of the magnetic field. In this way, the divergent magnetic field, in which the strength of the magnetic field (magnetic flux density) in the specimen chamber 22 further decreases at an appropriate gradient from the plasma extracting orifice 30 to the specimen table 27, is formed. In general, in the divergent magnetic field, the charge particles undergo circular motion, while the energy of the circular motion is converted to the kinetic energy in the direction of the divergent magnetic field with the angular momentum conserved. The charged particles are accelerated in the direction of the line of magnetic force along which the strength of magnetic field reduces. On this principle, the plasma is efficiently transported toward the specimen table 27 and, in addition, the diameter of the plasma stream 29 increases as the plasma stream 29 approached the specimen table 27. Assuming that the electrons and ions have the kinetic energy of about 10 eV and 0.1 eV, respectively, the radiuses of the circular motion of the electrons and the ions in the plasma are as small as about 0.1 mm and 1–3 mm (for a magnetic flux density of 875 G), respectively. Therefore, it can be considered that the plasma is extracted as such along the line of magnetic force. In this embodiment, the intensity of the magnetic flux density at the specimen table 27 is about 200 G, and the plasma stream 29 extracted with a diameter of 10 cm shows an increased diameter of about 20 cm on the specimen table 27.

The electrons, which have got the circular motion energy (which is considered to have an average value of about 10–30 eV) through the electron cyclotron resonance, reaches the specimen table 27 while 70–80% of the circular motion energy is converted to the kinetic energy in the direction of the magnetic force line by the divergent magnetic field mentioned above. This percentage will decrease somewhat, when considering the energy loss due to the collision with gaseous molecules during the movement.

In the plasma formed by the microwave discharge through the electron cyclotron resonance, the electrons have high energy. Thus, the electrons not only provide a high efficiency to dissociate and ionize the gaseous molecules, that is, a high activation efficiency but also are greatly accelerated in the direction of the divergent magnetic field, thereby reaching the specimen table 27. When an insulator is used as the surface material of the specimen table 27 or when the specimen table 27 is set in the electrically floating condition, the specimen table 27 is charged negatively by the incidence of electrons mentioned above. The negative potential accelerates the ions in the plasma toward the specimen table 27 and increases the incidence amount of the ions. The number of incidence electrons reduces with the generation of a negative potential and, therefore, an equilibrium state occurs when the incidence amount of the electrons coincide with that of the ions.

That is, in the plasma stream 29, such an electrostatic field is induced that the number of incidence ions is increased and the number of incidence electrons is reduced by the effect of the divergent magnetic field. In other words, the circular motion energy of the electrons is converted to the kinetic energy of the ions in the direction of the divergent magnetic field, and not only the electrons but also the ions are accelerated and reach the specimen table 27. This effect is called "plasma acceleration" in the field of nuclear fusion. In this case, the incident electrons still have 20–30% of the original circular motion energy and, therefore, effectively serves to improve the quality of the film deposited on the specimen substrate 28 in combination with the bombardment effect of the incident ions mentioned above at the specimen surface.

In addition to such an electrostatic field due to the divergent magnetic field, an electric field occurs to a certain degree at the surface of the specimen 28 due to the thermal motion of the electrons. This region of the plasma at the surface is called "ion sheath". The kinetic energy of the ions which reaches the surface of the specimen 28 is the sum of the kinetic energy generated by these electric fields, and has an extremely large effect on the deposition reaction to form a thin film.

Moreover, because the plasma is extracted along the line of magnetic force of the divergent magnetic field, the plasma stream 29 extracted with a diameter of 10 cm is widened to a diameter of about 20 cm on the specimen table 27. This realizes the formation of a large-area film in addition to the effect of the film-forming reaction.

For some films to be formed, the ion bombardment of an energy level higher than the ion incidence mentioned above will be effective. For such a case, it is possible for instance to apply a radio frequency power from the 13.56 MHz radio frequency power source 42 (including a matching circuit) to the specimen table 27 via the c capacitor 43, and to generate a negative self-bias voltage on the surface of the specimen 28 on the same principle as a radio frequency sputtering device, thereby increasing the ion bombardment effect. It is also possible to obtain the same effect by connecting a direct current power source with the specimen table 27 to provide a direct current potential. However, use of a radio frequency power is more effective when forming a film of insulating material.

As described above, the gas introducing system has the first gas introducing system 25, which is used to introduce the gas into the plasma formation chamber 21, and the second gas introducing system 26 which is used to directly introduce the gas into the specimen chamber 22. In this way, the gas introducing method can be selected according to the kind of the film to be formed and the kind of the raw material gases to be fed. For instance, when a silicon nitride film is to be formed, the stable $N_2$ gas is introduced from the first gas introducing system 25, and the $SiH_4$ gas which dissociates easily is introduced from the second gas introducing system 26. This $SiH_4$ gas is dissociated and ionized under the action of the plasma stream and reaches the surface of the specimen 28. The reaction mainly occurs on the surface of the specimen 28 to form a silicon nitride film. In this case, the ions and the electrons in the plasma, which has been extracted by the divergent magnetic field, impinge against the surface of the specimen 28 to promote the film-forming reaction, to dissociate and release H which is contained in the raw material gas $SiH_4$, and to strengthen the Si-N bond. Thus, according to the present invention, a firmly deposited thin film with a high quality can be formed, while avoiding the necessity of promoting the reaction by thermal energy.

Figure 8:
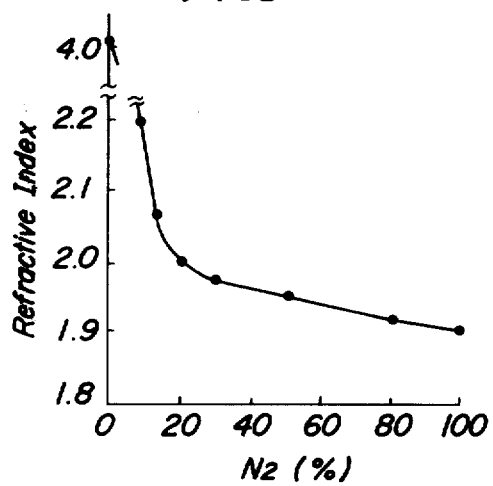
FIG. 8 is a characteristic curve diagram showing the relationship between the $N_2:Ar$ mixing ratio and the refractive index.

It is also possible to form a silicon film by introducing the Ar gas to the first gas introducing system 25, instead of the $N_2$ gas. FIG. 8 shows the relationship between the Ar:$N_2$ mixing ratio and the refractive index when introducing a mixture of the Ar and $N_2$ gases into the first gas introducing system 25. According to FIG. 8, the film formation could be controlled over a range from the Si film to the $Si_3N_4$ film when using a 200 W microwave power and introducing the $SiH_4$ gas at a rate of 10 cc/min. and the $N_2+Ar$ gas mixture at a rate of 20 cc/min. without heating the specimen table 27. Thus, the Si film could be obtained when $N_2$ is 0% and the $Si_3N_4$ film could be obtained when $N_2$ is 20%.

Figure 9:
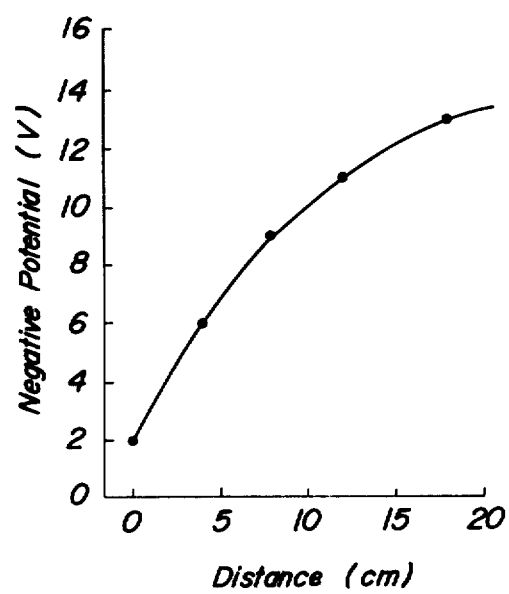
FIG. 9 is a characteristic curve diagram showing the relationship between the specimen table installing position with reference to the plasma formation chamber and the negative potential.

An example of a plasma deposition apparatus according to the present invention is explained below. When introducing the $N_2$ gas into the first gas introducing system 25, activating it and forming the plasma stream 29, a stable discharge could be achieved over a wide gas pressure range $3 \times 10^{-5}$ Torr or more in the specimen chamber 22. The optimum gas pressure range was $5 \times 10^{-5}$ to $3 \times 10^{-3}$ Torr. The data shown in FIG. 9 indicates that the method of extracting the plasma stream 29 by the divergent magnetic field is effective. It shows the relationship between the distance (cm) from the plasma extracting orifice 30 to the specimen table 27 and the negative potential (V) which is generated at the specimen table 27 located at that distance by using a 200 W microwave power. In this case, the $N_2$ gas was used and the gas pressure was $2 \times 10^{-4}$ Torr. The negative potential at the specimen table 27 increases as the distance increases or the effect of the divergent magnetic field increases. The negative potential amounted to 13–14 V at the distance of 20 cm. The energy of the ions reaching the surface of the specimen 28 was about 15–30 eV because the energy of acceleration due to the negative potential which is induced by the thermal motion of the electrons (ion sheath) was added. It is said that the negative potential of such a level is most preferable in the film-forming process. The negative potential values in FIG. 8 also mean that not only the electrons but also the ions are efficiently extracted by the divergent magnetic field.

Next, the results of the formation of the silicon nitride film with the use of the apparatus according to the present invention are described below. After evacuating the specimen chamber 22 to a vacuum of $8 \times 10^{-6}$ Torr, the $N_2$ gas was introduced into the first gas introducing system 25 at a rate of 15–20 cc/min. and the $SiH_4$ gas was introduced into the second gas introducing system 26 at a rate of 10 cc/min. The gas pressure in the specimen chamber 22 was set to about $2 \times 10^{-4}$ Torr, and a film was formed under the conditions of 100–400 W microwave power. The specimen table 27 was located at the position of 18 cm where the increase of the negative potential is almost saturated. At this time, the specimen table 27 was not heated, and the plasma deposition was started at normal temperature. In this case, the silicon nitride film could be formed efficiently at a deposition rate of 100–350 Å/min. The refractive index of the deposited silicon nitride film was 1.9–2.0 when measured by the ellipsometric analysis. According to the infrared absorption analysis, the absorption spectrum of the Si—N bond was clearly observed, while the spectrum of the Si—O bond due to oxygen impurity was not observed. When the rate of etching by the buffered hydrofluoric acid solution was measured to evaluate the acid resistance, it was as low as 100 Å/min. or less. Thus, the measurements revealed that a silicon film with a very high quality could be formed. In addition, compared with a silicon nitride film formed by the conventional CVD apparatus, the inner stress of the film obtained according to the present invention was considerably low. Therefore, a film with a thickness of 2 μm or more could be formed in a stable manner without developing cracks and peeling.

In addition to the silicon nitride film, a plasma deposition apparatus according to the present invention can be successfully used to deposit various films such as silicon, silicon dioxide, phosphorus-silicate glass, molybdenum silicide and tungsten silicide. For instance, when forming the silicon (Si) film the $SiH_4$ gas is introduced into the first gas introducing system 25, or alternatively, an inert gas such as Ar is introduced into the first gas introducing system 25 and $SiH_4$ is introduced into the second gas introducing system 26. For silicon dioxide ($SiO_2$) films, $O_2$ is introduced into the first gas introducing system 25 and $SiH_4$ is introduced into the second gas introducing system 26. For phosphorus-silicate glass (PSG) films, $O_2$ is introduced into the first gas introducing system 25, and a mixture of $SiH_4$ and $PH_3$ gases is introduced into the second gas introducing system 26. To form molybdenum silicide ($MoSi_2$) films, $MoF_6$ and $SiH_4$ are introduced into the first gas introducing system 25 and the second gas introducing system 26, respectively. Moreover, it is also possible to control the kind and the quality of films by additionally introducing other gases into the first and second gas introducing systems 25 and 26.

As described above, the present invention uses the microwave discharge under the electron cyclotron resonance conditions to form the plasma, and efficiently extracts the plasma stream by the divergent magnetic field so that a film can be deposited over a region of a large area. Therefore, the plasma with a high activity can be obtained at a low gas pressure, and a high-quality film can be formed at a low temperature through the bombardment effect of the ions and electrons. In addition, only a particular gas can be activated exclusively through the 2-system gas introduction to the plasma formation chamber and the specimen chamber. Moreover, according to the present invention, the plasma stream is utilized, and the plasma does not come into contact with the wall surface of the specimen chamber. As a result, the detrimental effect of the adsorption gas such as moisture can be minimized. In addition to these advantages, the present invention is also advantageous for the automation of the film-forming process and the in-process control because the plasma formation chamber is arranged separately from the specimen chamber.

It will be clear that the present invention can be applied not only to the deposition as described above but also to the plasma etching by introducing the gases containing halogen element such as $CF_4$.

The following is applied to the plasma deposition apparatus of FIG. 3 according to the present invention:

(1) The dimensions of the plasma formation chamber, which satisfy the conditions of the microwave cavity resonator, will slightly change according to the kind of the gas, the gas pressure or the microwave power introduced into plasma formation chamber 21.

(2) Even when the thermal energy is not utilized for the film forming reaction, the temperature of the specimen substrate will, in some cases, rise to about 150°–200° C. due to the heating action of the plasma, so that the apparatus cannot be applied to a specimen substrate having a very low heat resistance.

(3) In the composition of the divergent magnetic field, it is in some cases necessary to increase the plasma forming efficiency, the extracting efficiency and the uniformity of the plasma stream and, in addition, to change the region of deposition according to the applications.

Figure 10:
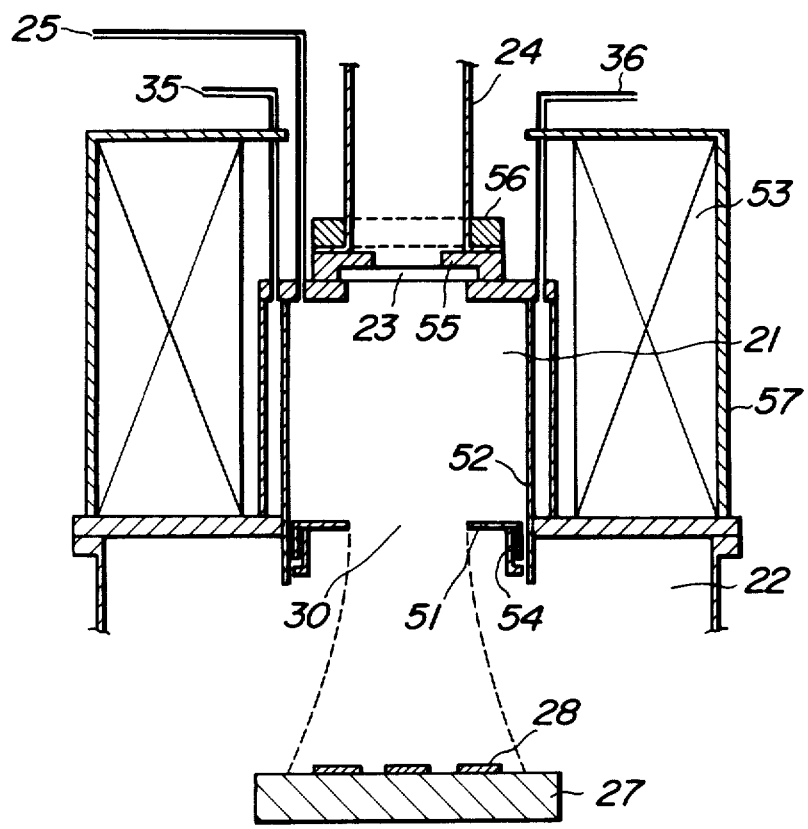
FIG. 10 is a sectional view showing another embodiment of a plasma deposition apparatus according to the present invention.

FIG. 10 shows an example of a plasma deposition apparatus according to the present invention, which solves the problems described above. FIG. 10 shows in detail the section corresponding to the upper half of the apparatus shown in FIG. 3. In FIG. 10, the end face plate 51 having the plasma extracting orifice 30 is set so that it can move vertically (with reference to the figure) in slight contact with the inner surface of the cylinder 52 which constitutes the plasma formation chamber 21. The lowermost end section of the cylinder 52, which constitutes the plasma formation chamber 21, is provided with a screw (not shown). This screw makes it possible to adjust the vertical dimension of the cylinder 52 which constitutes the plasma formation chamber 21. The magnetic coil 53 is installed around the periphery of the plasma formation chamber.

Moreover, a choke structure, which is already known in a microwave steric circuit, is installed at the end face plate 51 so that abnormal discharge may not be generated by the electric field by means of the microwave at the contacting section between the end face plate 51 and the inner surface of the cylinder 52. Such an abnormal discharge will adversely affect the plasma formation or unnecessarily waste the microwave power. That is, at the end face plate 51, a structure having the turn-back groove 54, which had a length of λg/4 for the wavelength λg of the microwave excited in the plasma formation chamber 21, is formed. In this way, the plasma formation chamber 21 is set so that it can function with the optimum efficiency as the microwave cavity resonator for all of various plasma forming conditions. In addition, it is necessary to efficiently convert the microwave, which has propagated through the rectangular waveguide 24, to the cavity resonance mode in the plasma formation chamber 21. For this purpose, the iris structure 55 is mounted at the microwave introducing window 23 so as to match the impedance.

In order to make the plasma effectively absorb the microwave electric field, which has been strengthened by the cavity resonance, it is necessary to correct the magnetic field distribution which is important for the electron cyclotron resonance conditions, and form a uniform magnetic field in the upper region in the plasma formation chamber 21. For this purpose, a circular member 56 made of high permeability material, e.g. soft iron, is arranged above the microwave introducing window 23 in this embodiment. In this embodiment, a disk which has a diameter of 15 cm and a thickness of 3 cm and which is provided with a rectangular opening with the same shape as the sectional outer shape of the rectangular waveguide 24, is used as the circular member 56. This circular member 56 is fitted to the rectangular waveguide 24.

Moreover, in order to adjust the distribution of the divergent magnetic field which is important to efficiently utilize the magnetic coil 53 and to extract the plasma, an outer case 57 made of high permeability material is arranged so as to cover the sides and the top of the magnetic coil 53. Although the embodiment of FIG. 3 uses the two-split magnetic coils 37 and 38 for convenience of apparatus manufacture, it is also possible to use a single magnetic coil 53 as shown in FIG. 10. FIG. 11 shows the condition of the line of magnetic force when the outer case 57 made of high permeability material is arranged. Such a configuration can prevent the magnetic field from leaking unnecessarily to the outside of the apparatus, and also can reduce the direct current power which is consumed by the magnetic coil 53.

In another embodiment according to the present invention, which is shown in FIG. 12, an outer case 61 is arranged, which is made of a high permeability material and which extends from the periphery of the magnetic coil 53 to the lower section of the periphery of the specimen chamber 22. By appropriately deciding the arrangement and the shape of this outer case, the distribution of the divergent magnetic field is adjusted, thereby constituting a divergent magnetic field in which the end section of the line of magnetic force turns in the direction nearly perpendicular to the center axis of the magnetic coil 53. In this embodiment, a concentric circular plasma extracting orifice 62 is used, and a plurality of specimens 63 are arranged at the cylindrical inner surface of the cylindrical specimen table 64. With this embodiment, films can be formed on many specimens 63 at the same time. In such a case, occurrence of defects due to dust dropping to the specimen surfaces can be reduced because the surfaces of specimens are nearly vertical. The construction shown in FIG. 12 is advantageously applicable to the embodiments of the present invention shown in FIG. 3 or 10.

In order to prevent dust from dropping to the specimen surface, it is also possible to invert the upper and lower sides of the apparatus configurations shown in FIGS. 3 and 10. In this case, however, the exhausting system 34 should be connected with the side section of the specimen chamber 22, and the specimen table 27 should be changed to a form of a specimen holder which can hold the specimen 28.

The results of experiments on the film formation with the plasma deposition apparatus according to the present invention, which has an improved performance as shown in FIG. 10 or FIG. 12, are described below. As an example, the $N_2$ gas was introduced into the first gas introducing system 25 at a rate of 10 cc/min., the $SiH_4$ gas was introduced into the second gas introducing system 26 at a rate of 10 cc/min., the gas pressure in the specimen chamber 22 was set at $2 \times 10^{-4}$ Torr, and a 200 W microwave power was applied to form the silicon nitride film. Heating was not performed for the specimen substrate 28, and the temperature during film formation was kept at 100° C. or less by using a heat dissipating fixture. In this experiment, the deposition rate was 300 Å/min., the deposition uniformity in the region of a diameter of 20 cm was ±5%, and an extremely firmly deposited film was obtained on the silicon or silicon dioxide substrate. The refractive index of this film was 2.0 according to the ellipsometric analysis and the resistance against hydrofluoric acid was extremely excellent (30 Å/min. or less for the buffered hydrofluoric acid solution).

With the conventional plasma-enhanced CVD and plasma stream transport apparatuses, the activation is insufficient and the specimen table is heated to make up for the insufficient activation. On the contrary, the plasma deposition apparatus according to the present invention eliminates the necessity of using thermal energy for the deposition reaction (or film-forming reaction), and can efficiently form films of an extremely high quality over a large area.

Figure 13:
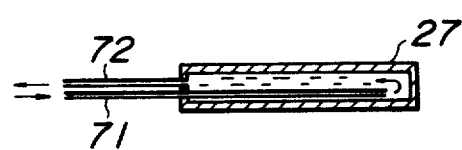
FIGS. 13 and 14 are diagrams showing two examples of the cooling system for the specimen table.
Figure 14:
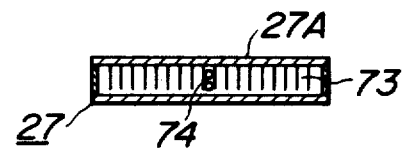

According to the present invention, it is not necessary to heat the specimen substrate 28 for the film-forming reaction and, therefore, it is possible to prevent the temperature rise (100°-200° C.) of the specimen 28 due to the plasma action by installing a cooling mechanism at the specimen table 27 shown, for example, in FIG. 3 or 10, instead of a heating mechanism as in the case of the conventional apparatus. By using the specimen table 27 provided with the cooling mechanism, it is possible to form films in a stable manner over a long period of time while keeping the specimen substrate at an extremely low temperature on the order of below 100° C. As the cooling mechanism for the specimen table 27, it is possible to use normal water or air cooling system. FIG. 13 shows an example of the water cooling system, in which cooling water is fed to the inside of the specimen table 27 from the water supply port 71 and is discharged from drain port 72. FIG. 14 shows an example of the air cooling system, in which a heat radiating fin 73 is installed on the upper cover 27A of the specimen table 27, and cooling air is fed and discharged through the cooling air inlet/outlet 74.

Use of the specimen table provided with such a cooling mechanism makes it possible to deposit films on a material with very low heat resistance such as semiconductor substrate having a resist pattern, and to form high-quality films on various substrates such as compound semiconductors with low heat resistance, superconducting materials and plastics. Particularly, formation of high-quality films on the resist patterns can be applied to the lift-off technology, which is already known in the semiconductor device manufacturing technology. Thus, it can be used for extremely wide range of applications and is important.

As explained above, according to the present invention, the microwave cavity resonator composition of the plasma formation chamber is operated more efficiently, and the distribution and composition of the divergent magnetic field, which is important for the electron cyclotron resonance discharge through the microwave and the plasma extraction are improved. Therefore, it becomes possible to generate highly active plasma in large amounts, and to irradiate the plasma to the specimen by increasing the reaction effect over a large area. Thus, high-quality films can be formed only with the action of the plasma without the aid of thermal energy. In addition, according to the present invention, high-quality films can be formed with a high productivity also on specimen substrates having an extremely low heat resistance, by using the specimen table provided with a cooling mechanism.

In the above descriptions, explanation has been made mainly with reference to silicon nitride $Si_3N_4$ as the material of film formation. However, it will be clear that the present invention can also be applied to the formation of films of various materials such as silicon Si, silicon dioxide $SiO_2$, molybdenum silicide $MoSi_2$, molybdenum Mo and aluminium Al.

What is claimed is:

1. A plasma deposition apparatus in which gases are introduced into a vacuum vessel, plasma is generated, molecules in said plasma are activated and reacted on a specimen substrate, on which a film is to be formed, so as to deposit a thin film on said specimen substrate, which comprises a specimen chamber having a specimen table for placing said specimen substrate thereon, and a plasma formation chamber arranged separately from said specimen chamber in order to make the gases, which are to be activated into the plasma condition, said plasma formation chamber being provided with a microwave introducing window, a microwave introducing means and a plasma extracting orifice provided with a metal grid plate which is formed in the wall opposite to said microwave introducing window in order to extract the plasma stream into said specimen chamber, a magnetic circuit being installed at the periphery of said plasma formation chamber so as to form a magnetic flux density necessary to bring about electron cyclotron resonance in said plasma formation chamber and to form, in said specimen chamber, a divergent magnetic field wherein the intensity of the magnetic flux density reduces at an appropriate gradient from said plasma formation chamber toward said specimen table in said specimen chamber.

2. A plasma deposition apparatus having a vacuum vessel into which gases are introduced to generate plasma, molecules in said plasma being activated and reacted on a specimen substrate, on which a film is to be formed, so as to deposit a thin film on said specimen substrate, comprising:

a specimen chamber having a specimen table in an electrically floating condition for placing said specimen substrate thereon;

a plasma formation chamber arranged separately from said specimen chamber for converting gases to be activated into the plasma condition, said plasma formation chamber being provided with a microwave introducing window, a microwave introducing means and a plasma extracting orifice which is formed in the wall opposite to said microwave introducing window for entracting a plasma stream generated in said plasma formation chamber into said specimen chamber, said plasma formation chamber having a shape and dimensions satisfying the conditions of a microwave cavity resonator;

a gas introducing system for said plasma formation chamber;

a gas introducing system for said specimen chamber so that gases so introduced are excited by said plasma; and a magnetic circuit disposed at the periphery of said plasma formation chamber for forming a magnetic flux density necessary to bring about electron cyclotron resonance in said plasma formation chamber and for forming, in said specimen chamber, divergent magnetic field with a magnetic flux density having a decreasing gradient from said plasma formation chamber toward said specimen table in said specimen chamber so as to accelerate said plasma, and so that high speed electrons formed in said plasma formation chamber by said cyclotron resonance can reach said specimen along the lines of magnetic force.

3. A plasma deposition apparatus as claimed in claim 2, further comprising a shutter which is opened and closed to interrupt said plasma stream, said shutter being arranged between said plasma extracting orifice and said specimen table.

4. A plasma deposition apparatus as claimed in claim 2, wherein a high frequency electric power is applied to said specimen table so as to generate a negative self-bias voltage on the surface of said specimen.

5. A plasma deposition apparatus as claimed in claim 2, wherein said specimen table has a cooling means.

6. A plasma deposition apparatus as claimed in claim 2, wherein said magnetic circuit has a magnetic coil for forming said divergent magnetic field for forming said plasma and for extracting said plasma, and high permeability material is arranged at the periphery of said magnetic coil, so that the distribution of the magnetic field in said plasma formation chamber and said specimen chamber can be adjusted by means of the arrangement and the shape of said high permeability material.

7. A plasma deposition apparatus as claimed in claim 6, wherein said plasma extracting orifice has a concentric circular opening, said specimen table is formed by a cylinder which is coaxial with the center axis of said magnetic coil, so that at least one specimen can be arranged at the inner surface of said cylinder, and an outer case made of said high permeability material is extended from the periphery of said magnetic coil to the periphery of said specimen chamber.

8. A plasma deposition apparatus comprising:

a plasma formation chamber into which raw material gases and microwave power are introduced to generate plasma, said plasma formation chamber having a structure of a cavity resonator with reference to the microwave electric power introduced for forming said plasma, and an end face plate which has a plasma extracting orifice for extracting said plasma as a plasma stream into said specimen chamber and a movable structure for adjusting the cavity resonance condition of said microwave;

a specimen chamber having a specimen table for placing a specimen thereon;

a first gas introducing system for introducing said raw material gases into said plasma formation chamber;

a second gas introducing system for introducing said raw material gases into said specimen chamber; and a magnetic circuit disposed at the periphery of said plasma formation chamber for forming a magnetic flux density necessary to increase the efficiency of plasma formation in said plasma formation chamber and for forming, in said specimen chamber, a divergent magnetic field with a magnetic flux density having a reducing gradient from said plasma formation chamber toward said specimen table in said specimen chamber so as to accelerate said plasma and so that high speed electrons formed in said formation chamber by said cyclotron resonance can reach said specimen along the lines of magnetic force.

9. A plasma deposition apparatus as claimed in claim 8, wherein said specimen table has a cooling means.

10. A plasma deposition apparatus as claimed in claim 8, wherein said magnetic circuit has a magnetic coil for forming said divergent magnetic field for forming said plasma and for extracting said plasma, and high permeability material is arranged at the periphery of said magnetic coil, so that the distribution of the magnetic field in said plasma formation chamber and said specimen chamber can be adjusted by means of the arrangement and the shape of said high permeability material.

11. A plasma deposition apparatus as claimed in claim 10, wherein said plasma extracting orifice has a concentric circular opening, said specimen table is formed by a cylinder which is coaxial with the center axis of said magnetic coil, so that at least one specimen can be arranged at the inner surface of said cylinder, and an outer case made of said high permeability material is extended from the periphery of said magnetic coil to the periphery of said specimen chamber.

12. A plasma deposition apparatus having a vacuum vessel into which gases are introduced to generate plasma, molecules in said plasma being activated and reacted on a specimen substrate, on which a film is to be formed, so as to deposit a thin film on said specimen substrate, comprising:

a specimen chamber having a specimen table in an electrically floating condition for placing said specimen substrate thereon;

a plasma formation chamber arranged separately from said specimen chamber for converting gases to be activated into the plasma condition, said plasma formation chamber being provided with a microwave introducing window, a microwave introducing means and a plasma extracting orifice provided with a metal grid which is formed in the wall opposite to said microwave introducing window for extracting a plasma stream generated in said plasma formation chamber into said specimen chamber; and a magnetic circuit disposed at the periphery of said plasma formation chamber for forming a magnetic flux density necessary to bring about electron cyclotron resonance in said plasma formation chamber and for forming, in said specimen chamber, a divergent magnetic field with a magnetic flux density having a reducing gradient from said plasma formation chamber toward said specimen table in said specimen chamber so as to accelerate said plasma.

* * * * *